(12) United States Patent
Ziegler et al.

(10) Patent No.: US 10,499,535 B2
(45) Date of Patent: Dec. 3, 2019

(54) MODULAR RACK SYSTEM

(71) Applicant: SCHNEIDER ELECTRIC IT CORPORATION, West Kingston, RI (US)

(72) Inventors: William Ziegler, Reading, MA (US); Louis Perry, Acton, MA (US)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 212 days.

(21) Appl. No.: 15/227,467

(22) Filed: Aug. 3, 2016

(65) Prior Publication Data

US 2018/0042133 A1    Feb. 8, 2018

(51) Int. Cl.
 *H01S 4/00*    (2006.01)
 *H05K 7/18*    (2006.01)
 *H05K 7/14*    (2006.01)

(52) U.S. Cl.
 CPC ............. *H05K 7/18* (2013.01); *H05K 7/1491* (2013.01); *H05K 7/1492* (2013.01); *H05K 7/1497* (2013.01)

(58) Field of Classification Search
 CPC .. H05K 7/1491; H05K 7/1492; H05K 7/1497; H05K 7/18
 See application file for complete search history.

(56) References Cited

U.S. PATENT DOCUMENTS

| | | | |
|---|---|---|---|
| 4,964,020 A | 10/1990 | Savage et al. | |
| 6,425,488 B1 | 7/2002 | Notohardjono et al. | |
| 7,591,056 B2 | 9/2009 | Mimlitch, III et al. | |
| 7,639,486 B2 * | 12/2009 | Champion | G06F 1/183 |
| | | | 211/26 |

(Continued)

FOREIGN PATENT DOCUMENTS

| | | |
|---|---|---|
| CN | 1194570 A | 9/1998 |
| CN | 1293474 A | 5/2001 |

(Continued)

OTHER PUBLICATIONS

Avelar, Victor, "How Overhead Cabling Saves Energy in Data Centers", White Paper 159, 2011 Schneider Electric—Data Center Science Center, pp. 1-8.

(Continued)

*Primary Examiner* — Paul D Kim
(74) *Attorney, Agent, or Firm* — Lando & Anastasi, LLP (57) ABSTRACT

A containerized data center modular rack system configured to mount electronic equipment and associated accessories is disclosed. A data center modular rack system may include a container structure with a floor and a ceiling configured to house a modular rack system. Further, a plurality of bottom anchor assemblies is disposed in the floor and a plurality of top anchor assemblies is disposed in the ceiling of the container structure. A plurality of modular supports is included; each having an upper end, a lower end, and a plurality of openings configured to mount electronic equipment and associated accessories. Each of the lower and (Continued)

upper ends of the plurality of modular supports is configured to be removably secured to the plurality of bottom and top anchor assemblies disposed in the ceiling of the container structure.

19 Claims, 11 Drawing Sheets

(56) References Cited

U.S. PATENT DOCUMENTS

| | | | |
|---|---|---|---|
| 8,031,468 | B2 | 10/2011 | Bean, Jr. et al. |
| 8,184,435 | B2 | 5/2012 | Bean, Jr. et al. |
| 8,193,448 | B2 | 6/2012 | Syed |
| 8,833,711 | B2 | 9/2014 | Fritz |
| 8,934,242 | B2 | 1/2015 | Bean, Jr. et al. |
| 9,420,884 | B2 * | 8/2016 | Newman ............... A47B 55/02 |
| 9,572,276 | B2 * | 2/2017 | Haroun ............... H05K 7/1485 |
| 2005/0259404 | A1 * | 11/2005 | Marraffa ............. H01M 2/1077 |
| | | | 361/726 |
| 2007/0205169 | A1 * | 9/2007 | Fratilla ................. A47B 47/02 |
| | | | 211/117 |
| 2009/0321371 | A1 | 12/2009 | Rathbone et al. |
| 2011/0240265 | A1 | 10/2011 | Dechene et al. |
| 2013/0055671 | A1 * | 3/2013 | Bruce ................. E04B 1/3483 |
| | | | 52/646 |

FOREIGN PATENT DOCUMENTS

| | | |
|---|---|---|
| EP | 0057580 A2 | 8/1982 |
| EP | 1876875 A2 | 1/2008 |
| GB | 2528379 A | 1/2016 |
| WO | 20130159157 A1 | 10/2013 |

OTHER PUBLICATIONS

Chatsworth Products, "Frame Supported Hot Aisle Containment (HAC) Solution", Oct. 10, 2014, Rev.5 10/14 MKT-60020-558, pp. 1-6.

Emerson Network Power, "SmartAisle™ Containment—Energy-efficient Data Center Cooling", Feb. 17, 2014, Emerson Electric Co.—pp. 1-32.

Minkels—Solution to Rely On—Varicondition® Cooling Solutions, "Free Standing Cold Corridor®—The ultra-modular, cost efficient aisle containment solution", A Group brandllegrand, Nov. 3, 2014, pp. 1-3.

Polargy—We Keep the Cloud Cool™, "Six Fundamental Data Center Containment Topologies", May 29, 2014, pp. 1-8.

Extended European Search Report from corresponding European Application No. 17184169.5 dated Dec. 5, 2017.

* cited by examiner

MODULAR RACK SYSTEM

CROSS-REFERENCE APPLICATION

This application relates to U.S. patent application Ser. No. 14/928,236, filed on Oct. 30, 2015 entitled DATA CENTER AIR CONTAINMENT SYSTEM by Barry Rimler, Joseph H. Bergesch, Yuchun Jiang, and Steven Brown, which is hereby incorporated herein by reference in its entirety for all purposes.

BACKGROUND

Field of the Invention

Embodiments of the present disclosure relate generally to racks and rack enclosures, and more specifically to modular rack systems and associated components that provide an integrated solution for supporting electronic equipment and related accessories.

Description of the Related Art

Racks and modular rack systems are generally used to receive and store electronic equipment and accessories to that equipment. Traditional equipment manufacturers may provide such racks in four post modular rack systems (e.g. a rack cabinet) or two post racks. For a large amount of electronic equipment, these traditional rack and modular rack systems may be placed adjacent to each other for the advantages of thermal airflow management, space conservation, or limiting a run of cables that may occur between racks to connect equipment housed in adjacent racks.

Physical support for electronic equipment may be accomplished by directly attaching the equipment to the rack or modular rack system. Alternatively, mounting equipment rails or shelves attached to the rack or modular rack system may also be used to support equipment. Equipment may generally be mounted in any orientation that the physical configuration of the equipment and modular rack system permits. Examples of such equipment which may be mounted include, computers, printed circuit assemblies, power or data distribution devices, cable management devices, doorways, or other associated accessories.

Existing racks and modular rack systems however are monolithic in nature and do not allow for robust nor rapid reconfiguration of equipment outside of repositioning the rack or modular rack system itself. In cases where physical space is extremely limited, such as a Modular Data Center, some racks or modular rack systems may not physically fit into the required space. Finally, such racks and modular rack systems may be costly due to the amount of compulsory components that accompany each type of system.

SUMMARY

A containerized data center modular rack system configured to mount electronic equipment and associated accessories is disclosed. A modular rack system may include a container structure with a floor and a ceiling configured to house a modular rack system. Further, a plurality of bottom anchor assemblies may be disposed in the floor and a plurality of top anchor assemblies may be disposed in the ceiling of the container structure. A plurality of modular supports may be included; each with an upper end, a lower end, and a plurality of openings configured to mount electronic equipment and associated accessories. Each of the lower and upper ends of the plurality of modular supports may be configured to be removably secured to the plurality of bottom and top anchor assemblies disposed in the ceiling of the container structure.

Principles of the disclosure provide the modular rack system may further comprise a twist lock insert assembly disposed axially in each of the upper ends of the plurality of modular supports and each of the lower ends of the plurality of modular supports. Further, the plurality of bottom anchor assemblies and the plurality of top anchor assemblies may include a base with a first side, a second side, and a first fastening connector. This first fastening connector may be disposed axially to the first side of the base and configured to releasably secure the lower ends of the plurality of modular supports or the upper ends of the plurality of modular supports. The twist lock insert assembly disposed axially in the upper end of the plurality of modular supports and lower end of the plurality of the modular supports may be utilized and the second side may be secured to the floor or the ceiling of the container.

Alternate embodiments of the disclosure may comprise a twist lock insert assembly disposed within the floor or the ceiling of the container structure and a second fastening connector disposed axially to the second side of the base. Both the lower end of the plurality of modular supports and the upper end of the plurality of modular supports may be releasably secured utilizing the twist lock insert assembly disposed axially in the upper end of the plurality of modular supports and lower end of the plurality of the modular supports. The second side of the base may be releasably secured to the floor or the ceiling of the container utilizing the twist lock insert assembly disposed therein.

Alternate embodiments of the disclosure may include the plurality of bottom anchor assemblies and the plurality of top anchor assemblies including a "U" bracket which may be disposed on the floor or the ceiling of the container structure. These brackets may be releasably secured the lower end of the plurality of modular supports or the upper end of the plurality of modular supports and secured to the floor or the ceiling of the container structure.

Principles of the disclosure provide at least one cross member may be releasably secured between the plurality of modular supports at an elevation along a height of adjacent modular supports. Further, a threaded flange assembly may be disposed on the plurality of openings in the plurality of modular supports. Further, a plurality of openings in the plurality of modular supports may be disposed in pairs within the same horizontal plane. Additionally, the plurality of modular supports may be extended and retracted to achieve a height. Also, the plurality of modular supports may be configured to support cable management equipment.

Alternate embodiments of the disclosure may include a cantilever assembly each having two or more arms and a plurality of supports releasably secured to the plurality of modular supports at an elevation along a height of adjacent modular supports, the cantilever assembly configured to support electronic equipment. Further, the cantilever assembly may be configured to support one of a bus bar assembly, network basket, or power ladders. Additionally, one or more blanking panels releasably secured to the plurality of modular supports may enclose a space defined by the plurality of modular supports. Also, a door frame assembly may be disposed between the pluralities of modular supports, the door frame assembly may include two vertical supports and a horizontal support, and the door fame assembly may be configured to support one or more doors.

Alternate embodiments of the disclosure may also include a kit for a modular rack system configured to mount electronic equipment. This kit may include a bottom anchor assembly, a top anchor assembly, a modular support with an upper end, a lower end, and a plurality of openings configured to mount electronic equipment, a bottom anchor assembly configured to be secured to a floor and releasably secure the lower end of the modular support, a top anchor assembly configured to be secured to a ceiling and releasably secure the upper end of the modular support; and a cantilever assembly releasably secured to the modular support at an elevation along a height of the modular support, the cantilever assembly configured to support electronic equipment.

Alternate embodiments of the kit may also include, a plurality of bottom anchor assemblies, a plurality of top anchor assemblies, a plurality of modular supports where each modular support may have an upper end a lower end, and a plurality of openings disposed therein and configured to mount equipment, and the modular support is extended and retracted to achieve a height.

Further alternate embodiments of the kit may also include, a plurality of cable management assemblies configured to be supported by the plurality of modular supports, a plurality of blanking panels releasably secured to the plurality of modular supports to enclose a space defined by the plurality of modular supports, a door frame assembly disposed between the plurality of modular supports, the door frame assembly including two vertical supports and a horizontal support, the door fame assembly being configured to support one or more doors.

BRIEF DESCRIPTION OF THE DRAWINGS

These accompanying drawings are not intended to be drawn to scale. In the drawings, each identical or nearly identical component that is illustrated in various figures is represented by a line numeral. For purposes of clarity, not every component may be labeled in every drawing. In the drawings.

DETAILED SUMMARY

This invention is not limited in its application to the details of construction and the arrangement of components set forth in the following descriptions or illustrated by the drawings. The invention is capable of other embodiments and of being practiced or of being carried out in various ways. Also, the phraseology and terminology used herein is for the purpose of descriptions and should not be regarded as limiting. The use of "including," "comprising," "having," "containing," "involving," and variations herein, are meant to be open-ended, i.e. "including but not limited to."

A "brick and mortar" data center may be designed to house a large number and type of electronic equipment. Examples of such may include data processing, storage, and networking equipment. When housed in a data center, such equipment generally resides within equipment racks or modular rack systems. Each rack or modular rack system may be configured to include an open frame consisting of two or four posts. A four post rack may also be enclosed on each side, top, and bottom. For air containment, privacy, or security each individual rack may include side panels, a ceiling, and a roof. A door may also replace a front panel so as to readily enable access into the interior of the equipment rack. Such equipment racks are generally monolithic in construction where the basic structure of the rack or rack enclosure may not be modified. Some may be rolled into and out of position on pre-assembled wheel assemblies, while others bolted to the floor or walls of the data center itself. Once the rack or modular rack system is secured, electronic equipment or accessories may be positioned within the equipment rack.

Today, not all data centers are "brick and mortar" yet retain many of the needs of such a facility. A prefabricated data center may be a complete data center that is able to be deployed in any variety of environments including those which are confined, remote, or environmentally harsh. In such cases a traditional "brick and mortar" data center may not be a viable option, perform adequately or at all. Rapid deployment, scalability, and functionality are advantageous to a successful deployment. Further, such applications may be critically restricted by cost or the available space within the enclosure to place equipment. Optimization of available space is highly desirable.

To address the problem at least one embodiment of the present disclosure is directed to a modular rack system. This system may include a containerized data center modular rack system configured to mount electronic equipment and any associated accessories. A data center modular rack system may include a container structure with a floor and a ceiling configured to house a modular rack system. Further, a plurality of bottom anchor assemblies is disposed in the floor and a plurality of top anchor assemblies is disposed in the ceiling of the container structure. A plurality of modular supports is included; each with an upper end, a lower end, and a plurality of openings configured to mount electronic equipment and associated accessories. Each of the lower and upper ends of the plurality of modular supports is configured to be removably secured to the plurality of bottom and top anchor assemblies disposed in the ceiling of the container structure.

Figure 1:
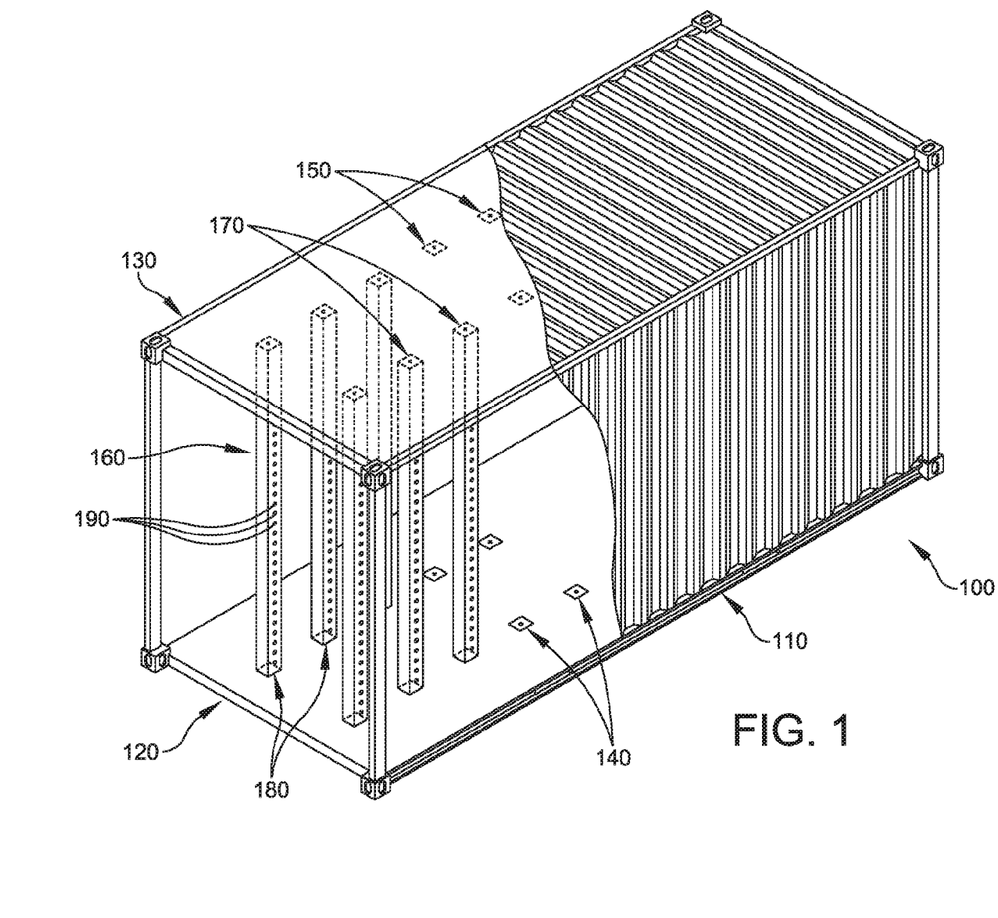
FIG. 1 illustrates aspects of a modular rack system in accordance with various embodiment of this disclosure.

Referring now to FIG. 1, aspects of a containerized modular rack system 100 in accordance with various embodiments of this disclosure are illustrated. Basic components of embodiments of this system may include a container 110, with a floor 120, and a ceiling 130. A plurality of bottom anchor assemblies 140 and a plurality of top anchor assemblies 150 may also be included. A plurality of modular supports 160, each with an upper end 170, a lower end 180, and a plurality of openings 190 are configured to mount electronic equipment or associated accessories.

Each bottom anchor assembly 140 and top anchor assembly 150 are secured to the floor 120 and ceiling 130 respectively. Various embodiments of these anchor assemblies are described herein. Embodiments of this disclosure contemplate methods of removably securing and non-removably securing the bottom anchor assembly 140 and top anchor assembly 150. Each upper end 170 and lower end 180 of each modular support 160 is removably secured to the respective bottom anchor assembly 140 and top anchor assembly 150. Embodiments of this system configuration allow for rapid and flexible deployment of a modular rack system.

The container 110 may be implemented using containers of various sizes and construction, each highly dependent on the application. For example, a container may have a form factor large enough to contain the entire required infrastructure for computing operations such as power, cooling, security, and modular rack system infrastructure. Various embodiments allow for dedicated containers for a singular purpose such as power generation or distribution, cooling generation or distribution, or computer resource operation and storage. Such a container may be thermally insulated or weather resistant to operate in austere environmental conditions. Many form factors of a container 110 exist and are contemplated in embodiments of this disclosure.

A container 110 need not reside in an outdoor environment as principles of the disclosure contemplate indoor applications. Containers 110 to house electronic equipment of more compact form factors suitable for indoor use are also contemplated. Small cabinet or under desk storage units are embodied in this disclosure. Modular rack systems in accordance with at least some embodiments allow for modular, scalable, and rapid deployment of a full range of electronic equipment from very large stand alone systems, to very small indoor cabinets.

Figure 2:
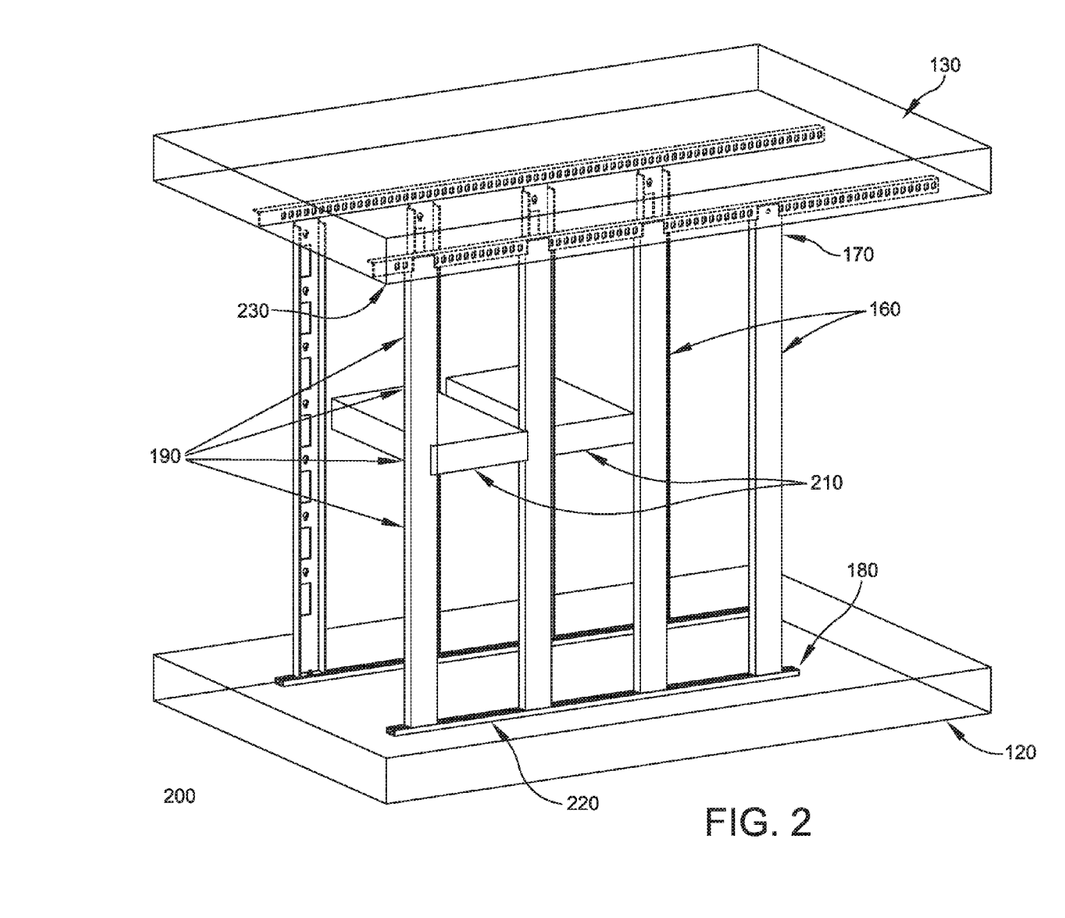
FIG. 2 illustrates another embodiment of aspects of a modular rack system in accordance with various embodiment of this disclosure.

FIG. 2 shows a portion 200 of the enclosure 100 of FIG. 1 with alternate anchor assemblies. The portion 200 includes the floor, 120 the ceiling, 130 and the plurality of modular supports 160. The modular supports 160 support electronic equipment 210 utilizing the plurality of openings disposed in the modular support 160. Alternate anchor assemblies include bottom anchor assemblies 220 and top anchor assemblies 230. Each upper end 170 and each lower end 180 of each modular support 160 are releasably secured to the bottom anchor assemblies 220 and the top anchor assemblies 230. While embodiments including a container 110 are contemplated, so too is any structure with both a floor 120 and a ceiling 130 capable of supporting the load provided by the electronic equipment 210.

Principles of the disclosure contemplate various locations of the anchor assemblies and modular supports within the structure to contain the modular rack system, thereby allowing adjustability in the width of the space which mounts the electronic equipment 210. This configurability allows the supported electronic equipment 210 to be mounted in configurations specific to the application. For example, one or more rows of electronic equipment may be aligned directly adjacent to each other to allow containment and movement of warm or cold air. Other examples may include a space between modular supports to allow for access for an operator, mounting of rack system accessories, such as power distribution, or to provide an isolated rack enclosure for particular electronic equipment 210.

Figure 3A:
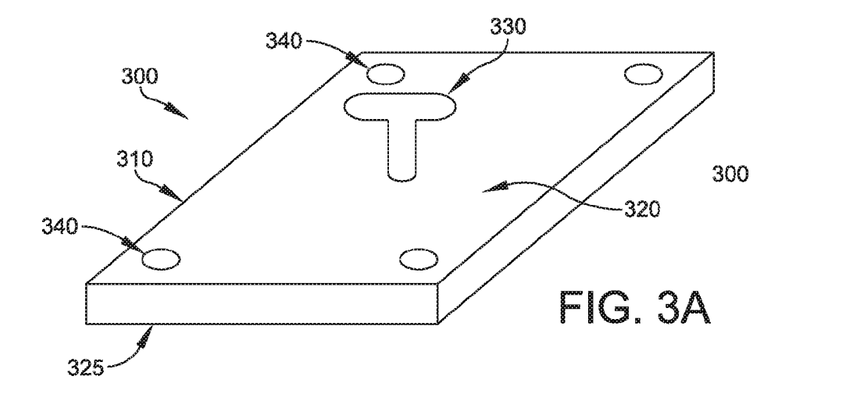
FIG. 3A illustrates a perspective view of an anchor assembly of a modular rack system in accordance with various embodiments of this disclosure.
Figure 3B:
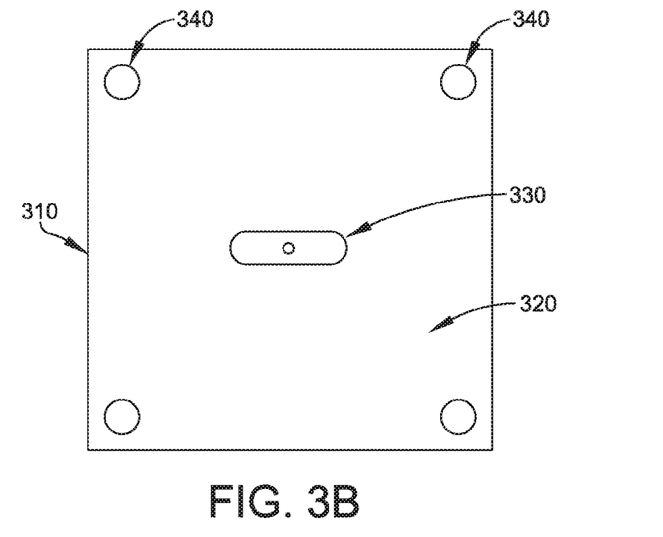
FIG. 3B illustrates a top view of FIG. 3A in accordance with various embodiments of this disclosure.

FIG. 3A illustrates a perspective view of an embodiment of an upper or lower anchor assembly 300, which may be used in different embodiments described herein. FIG. 3B illustrates a top view of the assembly 300 of FIG. 3A. Each anchor assembly contains a base 310 which forms the basic outline of the anchor assembly 300. While a roughly square shape is illustrated in FIG. 3A and FIG. 3B, the basic shape of the base may be any shape, such as, but not limited to square, rectangle, triangle, or circular which provides adequate support for the modular support 160 to be attached. Each base 310 has a first side 320 with a first fastening connector 330 disposed axially to the first side 320.

In different embodiments, the first fastening connector 330 may be disposed axially at any point of the first side 320 of the base 310. While FIG. 3A and FIG. 3B illustrate the first fastening connector 330 disposed axially on the center of the first side 320, any location may be used. The first fastening connector 330 may be shaped in any way so as to be configured to be mechanically accepted by a twist lock insert assembly disposed within the floor 120, ceiling 130, upper end 170, or lower end 180 of the modular support 160.

Connectors detailed herein while characterized as "twist locks" or "fastening connectors" are intended to represent mating mechanical connectors which may be articulated to secure the mating features without additional hardware or tools. Mechanical locking connections of this type and construction are contemplated in embodiments of this disclosure, including the use of the various available types, shapes, and compositions available.

Embodiments of an upper or lower anchor assembly 300 may also contain a plurality of base mounting holes 340 disposed throughout the base 310. Such base mounting holes 340 may form patterns in the base 310 and may be at particular locations to secure the second side 325 of the base 310 to the floor 120 or the ceiling 130. Numbers and dimensions of the base mounting holes 340 may be various to support the shape of the base 310 and dimensions of any hardware used to mount the upper or lower anchor assembly 300.

Figure 4:
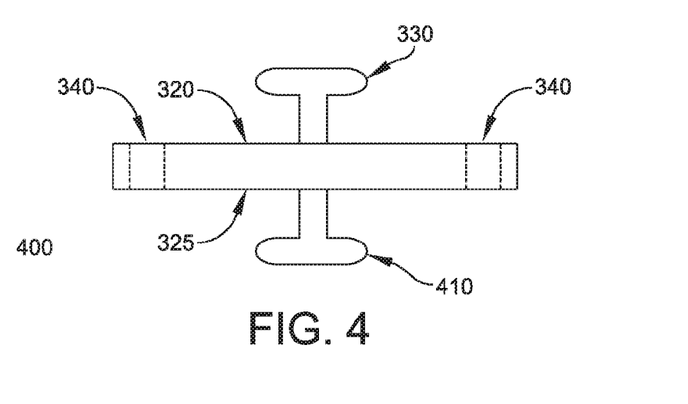
FIG. 4 illustrates a side view of another embodiment of an anchor assembly of a modular rack system in accordance with various embodiments of this disclosure.

FIG. 4 illustrates a side view of an alternate embodiment of an upper or lower anchor assembly 400. While many similar features are illustrated from FIGS. 3A and 3B, a second twist lock assembly 410 is included on the second side 325 of the base 310 in the assembly 400. This second twist lock assembly 410 may be utilized to secure the upper or lower anchor assembly 400 into the floor 120 or the ceiling 130 of a container 110 or other suitable structure. It should be appreciated that the first twist lock assembly 330 and second twist lock assembly need not be identical to each other and may be offset from each other to allow desired operation.

Figure 5A:
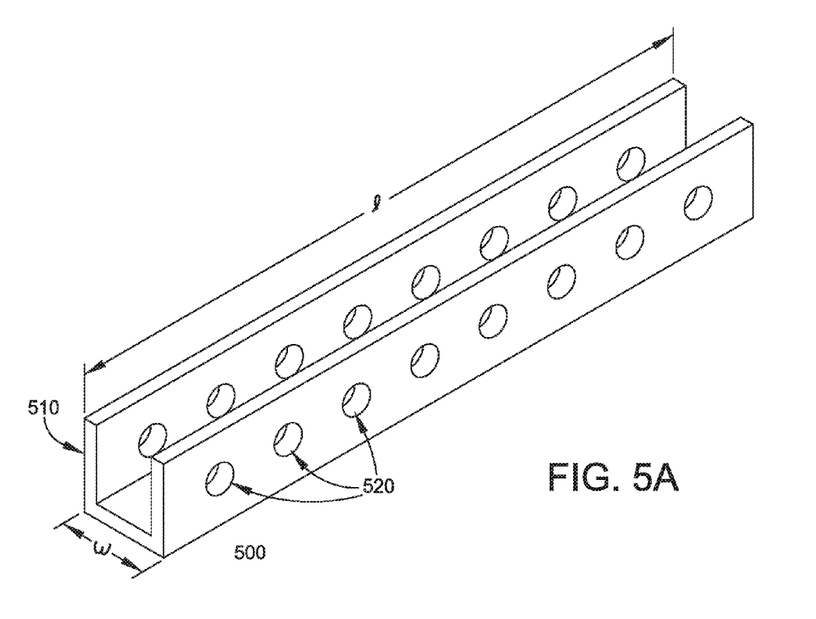
FIG. 5A illustrates a perspective view of another embodiment of an anchor assembly of a modular rack system in accordance with various embodiments of this disclosure.
Figure 5B:
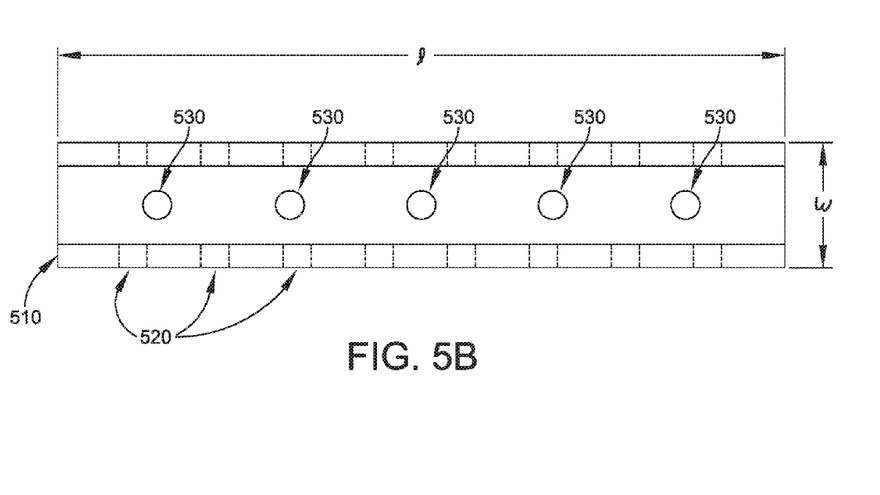
FIG. 5B illustrates a top view of an anchor assembly of FIG. 5A in accordance with various embodiments of this disclosure.

FIG. 5A illustrates a perspective view of yet another embodiment of an upper or lower anchor assembly 500. FIG. 5B illustrates a top view of the assembly of FIG. 5A. In this embodiment the upper or lower anchor assembly 500 includes a "U" bracket 510 as illustrated. The bracket 510 has a width w to accommodate the width of a modular support 160, and the bracket 510 has a length/to accommodate application specific spacing of modular supports 160 and dimensions of the container 110 or other structure used for the overall system.

The anchor assembly 500 may also have one or more base support holes 530 to secure the upper or lower anchor assembly 500 to the floor 120 or ceiling 130. Securing the upper or lower anchor assembly 500 may be accomplished by hardware appropriate for the construction of the floor 120 or ceiling 130. Numbers and dimensions of the base support holes 530 may be various to support the shape of the upper or lower anchor assembly 500 and dimensions of any hardware used for mounting. It should be appreciated that various hardware types contemplated in embodiments of this disclosure may be used to secure the upper or lower anchor assembly 500 to the floor 120 or ceiling 130.

Further, each support may also have modular support holes 520 which secure the modular support 160 placed within the upper or lower anchor assembly 500 using different types of hardware. Numbers and dimensions of the modular support holes 520 may be various to support the shape of the upper or lower anchor assembly 500 and dimensions of any hardware used for mounting. It should be appreciated that various hardware types are contemplated in embodiments of this disclosure and used to secure and releasably secure the modular support 160 to the upper or lower anchor assembly 500.

It should be appreciated that materials used in construction of embodiments of the upper and lower anchor assemblies are various. Plastic, steel, carbon fiber, or other material is able to be used provided the material is suitable to support the structural load. Further, any combination of embodiments of upper and lower anchor may be used in a single modular rack system. Implementations are not limited to any one embodiment nor limited by the embodiment chosen.

Figures 6, 7:
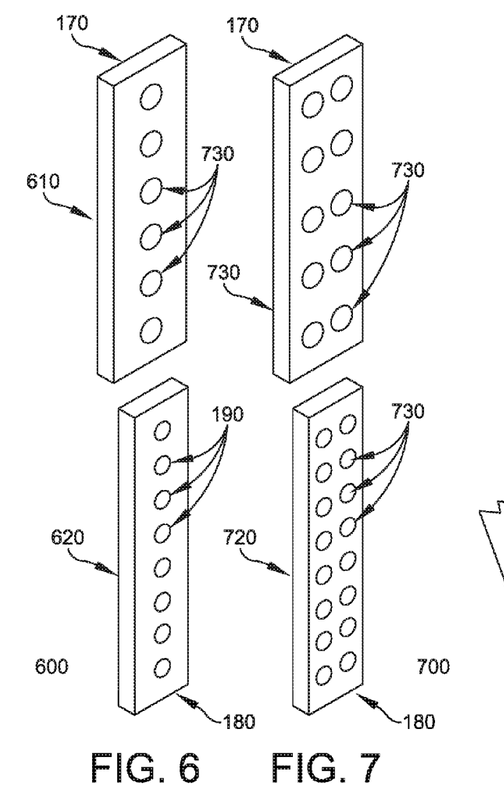
FIG. 6 illustrates a perspective view of a modular support of a modular rack system in accordance with various embodiments of this disclosure.
FIG. 7 illustrates a perspective view of another embodiment of a modular support of a modular rack system in accordance with various embodiments of this disclosure.

FIGS. 6 and 7 illustrate perspective views of modular supports 610, 620, 710 and 720 which may used in place of supports discussed above in embodiments of a modular rack system. Embodiments of a modular support may be constructed of a single piece 160, may contain an upper modular support 610, 710 and a lower modular support 620, 720, or multiple support sections. An upper modular support 610, 710 will have an upper end 170 that secures to an upper anchor assembly and a lower modular support 620, 720 will have a lower end 180 that secures to a lower anchor assembly, embodiments of which are detailed herein. Should a modular support comprise three or more sections, only the uppermost and lowermost will be secured to an upper or lower anchor assembly.

A modular support 160 constructed of more than one piece 600, 700 may be adjusted to a particular height based on the container 110 or other structure designated to house the modular rack system. Components of the modular support such as an upper modular support 610, 710 and a lower modular support 620, 720 may be constructed to be concentric such that modular support pieces fit within another modular support piece to allow the support to be adjustable to a desired height. Adjustability may be achieved by extending or retracting components of the modular support to achieve a desired height. Fastening of the upper modular support 610, 710 and the lower modular support 620, 720 may be accomplished by placing hardware within one or more of the plurality of openings 190 at a point where the upper modular support 610, 710 and the lower modular support 620, 720 overlap. Other fastening methods may be utilized which do not require the placement of hardware within the plurality of openings 190 and may exist on the outside of the modular support at the junction of the upper modular support 610, 710 and the lower modular support 620, 720. Such connection methods of concentric supports are contemplated in embodiments of this disclosure.

A plurality of openings 190 may exist in each modular support 160 to mount electronic equipment 210. Such openings may be of various shapes for example, but not limited to, circular, oval, square, keyhole, or rectangular. Shapes, numbers and dimensions of the plurality of openings 190 may be various to support the shape and dimensions of any hardware used for mounting the electronic equipment 210 to the modular support 160. For example, a modular support 160 may have a plurality of openings 190 disposed in a single column vertically aligned from upper end 170 to lower end 180 as illustrated in FIG. 6. Alternatively, a modular support 160 may have a plurality of openings 190 disposed in two columns vertically aligned from upper end 170 to lower end 180 as illustrated in FIG. 7 700. In such latter embodiments the plurality of openings 190 may be disposed in pairs within the same horizontal plane. Other patters of the plurality of openings 190 may exist such as offset pairs or more than two openings.

The plurality of openings 190 which exist in each modular support 160 may be disposed on the length or width of the modular support 160. Various shape openings may be disposed in various patterns on each side of the modular support. As one of many examples, round openings may be disposed on the width of the modular support 160 to support electronic equipment 210, and keyhole openings may be disposed on the length, near the ends of the modular support 160 to accommodate the securing of modular rack system accessories for example, but not limited to, modular power distribution. It should be appreciated there is wide variability in the type, location, and disposition pattern of the plurality of openings 190 on the modular support 160.

Figure 8:
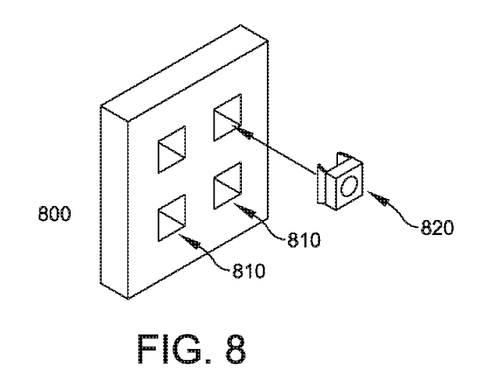
FIG. 8 illustrates an exploded perspective view of a modular support and the openings configured to mount electronic equipment of a modular rack system in accordance with various embodiment of this disclosure.

An exploded perspective view of alternate embodiments of mounting electronic equipment 210 to a modular support 160 is illustrated in FIG. 8. In this illustration a modular support 160 and plurality of openings 810 are shown, each substantially square. As one of many examples of mounting hardware, a device commonly called a "cage nut" or "rack nut" 820, is inserted into any of the plurality of openings 810. Electronic equipment 210 may them be mounted to the modular support utilizing threaded hardware to secure the electronic equipment. Embodiments of "Cage nuts" and "rack nuts" are contemplated in embodiments of this disclosure for mounting electronic equipment.

Figure 9:
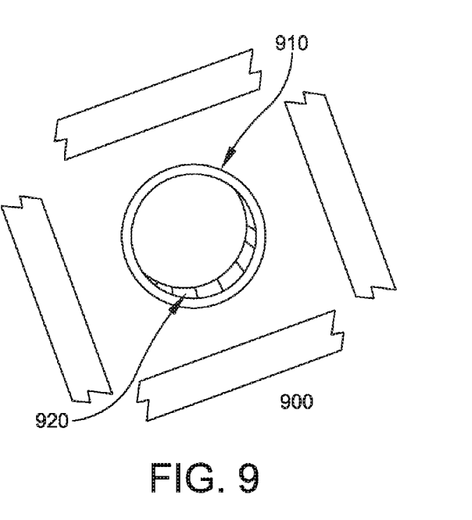
FIG. 9 illustrates an exploded perspective view of another embodiment of an opening configured to mount electronic equipment of a modular rack system in accordance with various embodiment of this disclosure.

Further embodiments are illustrated in the exploded perspective view for one of the plurality of openings 190 configured to mount electronic equipment of a modular rack system in FIG. 9. In such embodiments a threaded flange assembly is disposed on each of the plurality of openings 190 for each modular support 160. Such a device may be integrated mounting hardware for mounting electronic equipment 210. Such a device may only require a mating hardware component to secure electronic equipment thereby limiting the necessary hardware to complete a system.

It should be appreciated various embodiments of modular supports disclosed herein may be used in combination to provide various mounting options of electronic equipment or other accessories. As one of many examples, a modular support 160 with a plurality of openings 190 disposed in a single column vertically aligned from upper end 170 to lower end 180 as illustrated in FIG. 6 may be used for all modular supports in a system. In such an example, two modular supports 160 may be used for a "two post rack" application where the electronic equipment 210 is mounted in the plurality of openings 190 between two adjacent modular supports.

A "four post rack" example may include four modular supports 160 and may be used for an application where the electronic equipment 210 is mounted in the plurality of openings 190 between all four modular supports. FIGS. 1 and 2 illustrate embodiments of a "four post rack."

Further embodiments may include use of modular supports 160 with a plurality of openings 190 disposed in a single column vertically aligned from upper end 170 to lower end 180 as illustrated in FIG. 6 and modular supports 160 which have a plurality of openings 190 disposed in two columns vertically aligned from upper end 170 to lower end 180 as illustrated in FIG. 7. In such embodiments modular supports with a plurality of openings 190 disposed in a single column vertically aligned from upper end 170 to lower end 180 may be located on the end of the modular rack system. Modular supports with a plurality of openings 190 disposed in two columns vertically aligned from upper end 170 to lower end 180 may be located in interior portions of the modular rack system. In this combination, a substantial less amount of modular rack system hardware is needed to mount electronic equipment 210 as fewer modular supports are required as each interior modular support can act as a support for two adjacent stacks of equipment.

Principles of the disclosure contemplate combinations of embodiments of the use of a plurality of modular supports 160 with a plurality of openings 190. No limitations are implied regarding the various embodiments of modular supports 160 and each may be used with the other. For example modular supports 160 with a plurality of openings 190 disposed in a single column vertically aligned from upper end 170 to lower end 180 as illustrated in FIG. 6 and modular supports 160 which have a plurality of openings 190 disposed in two columns vertically aligned from upper end 170 to lower end 180 as illustrated in FIG. 7 700 may be used together in combination, or distinct from each other. No limitations are implied in their use.

Figure 10A:
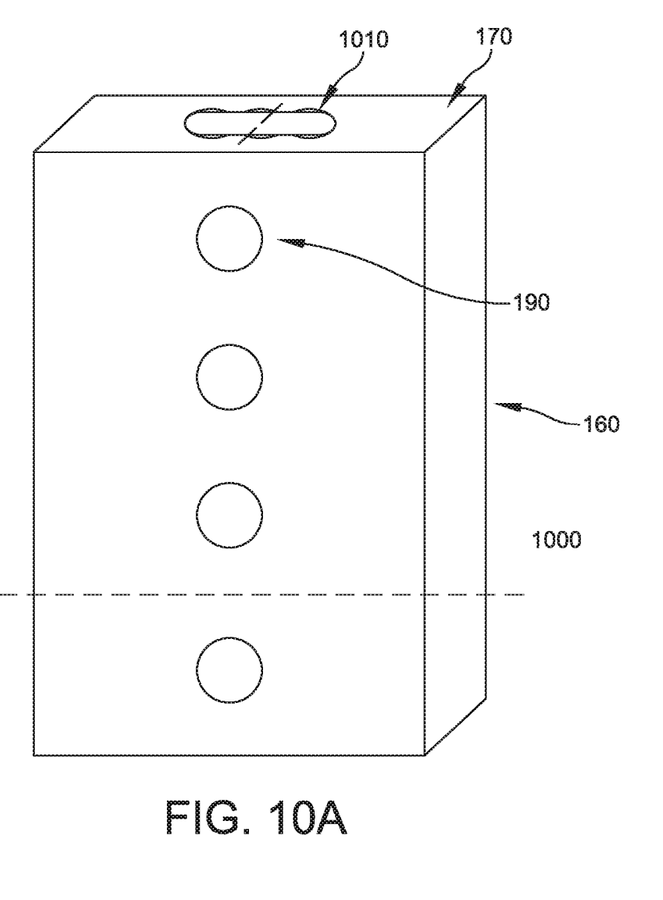
FIG. 10A illustrates a perspective view of another embodiment of a modular support and twist lock insert assembly of a modular rack system in accordance with various embodiments of this disclosure.
Figure 10B:
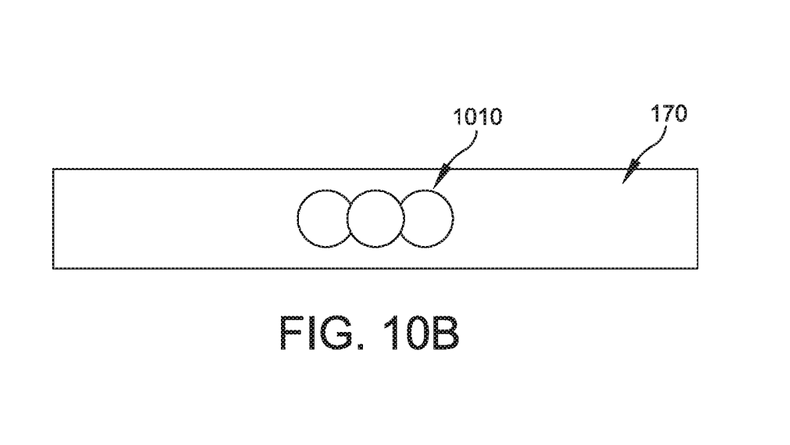
FIG. 10B illustrates a top view of the modular support of FIG. 10A in accordance with various embodiments of this disclosure.

In various embodiments where the modular support 160 is releasably secured to the bottom anchor assemblies 220 and top anchor assemblies 230, a modular support twist lock insert assembly 1010 may be provided (see, FIGS. 10A and 10B). This modular support twist lock insert assembly 1010 is the mechanical mate to the first fastening connector 330 and may be disposed axially at any point of the first side 320 of the base 310. This first fastening connector 330 may be shaped in any way so as to be configured to be mechanically accepted by the modular support twist lock insert assembly 1010. It should be appreciated each of the upper end 170 and the lower end 160 of the modular support 160 may contain such a modular support twist lock insert assembly 1010.

Further, embodiments utilizing lower and upper anchor assemblies illustrated in FIG. 4 which possess a second fastening connector 410 may utilize a container twist lock insert assembly disposed within the floor 120, ceiling 130, of a container 110 or other structure to contain the modular rack system. Principles of the disclosure contemplate these embodiments which allow for substantial flexibility in deployment of a modular rack system.

It should be appreciated, connectors detailed herein while characterized as "twist locks" or "fastening connectors" are intended to represent mating mechanical connectors which may be articulated to secure the mating features without additional hardware or tools. Various embodiments of mechanical locking connections of this type and construction are contemplated in this disclosure, including the use of the various available types, shapes, and composition.

Figure 11:
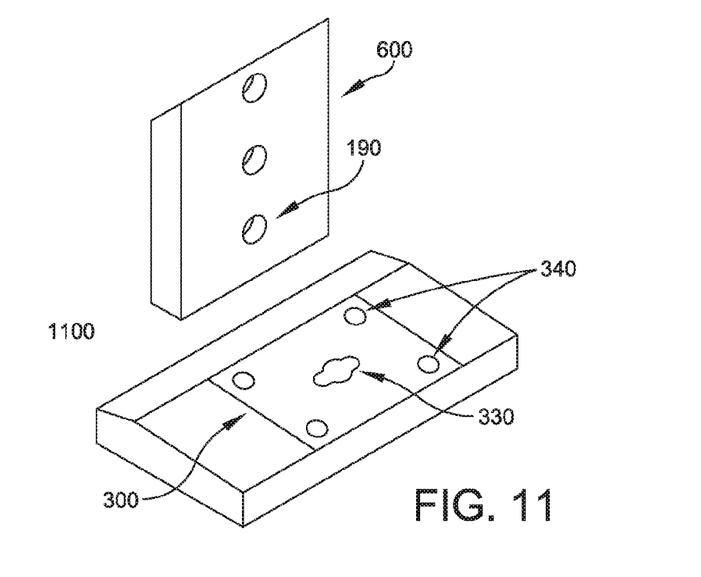
FIG. 11 illustrates a perspective view of components of the assembled modular support and anchor assembly utilizing a twist lock in accordance with various embodiments of this disclosure.

FIG. 11 illustrates an exploded perspective view of components 1100 for an assembled modular support and anchor assembly utilizing a "twist lock" anchor assembly. Various embodiments utilize an upper or lower anchor assembly 300 secured to a floor 120 or ceiling 130 through a plurality of base mounting holes 340. The modular support 600 with a modular support twist lock insert assembly 1010 is operatively connected to a first fastening connector 330.

It should be appreciated various embodiments may exist given this structure. For example, an upper or lower anchor assembly 300 may be secured utilizing lower and upper anchor assemblies illustrated in FIG. 4 which possess a second fastening connector 410 and may utilize a container twist lock insert assembly disposed within the floor 120, ceiling 130, of a container 110 or other structure to contain the modular rack system. Once the upper or lower anchor assembly 300 is secured into the floor 120 or the ceiling 130, a modular support 600 with a modular support twist lock insert assembly 1010 is operatively connected to a first fastening connector 330.

Figure 12:
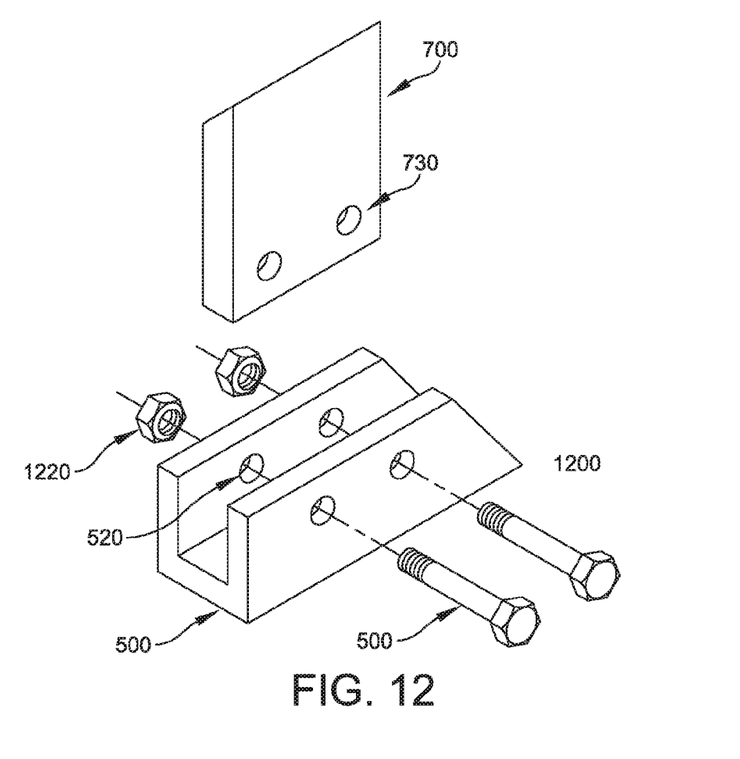
FIG. 12 illustrates a perspective view of components of the assembled modular support and anchor assembly utilizing a "U" bracket in accordance with various embodiments of this disclosure.

FIG. 12 illustrates an exploded perspective view of components 1200 for an assembled modular support and anchor assembly utilizing a "U" bracket. Various embodiments utilize an upper or lower "U" bracket anchor assembly 500 secured to a floor 120 or ceiling 130 through a plurality of base support holes 530. A modular support 700 with mounting hardware 1210 such as screws or bolts are passed through support holes 520 which secure the modular support 700 placed within the upper or lower anchor assembly 500. Such mounting hardware 1210 is secured by the appropriate hardware fastener 1220 to secure the modular support. It should be appreciated such mounting hardware 1210 and hardware fasteners 1120 may be secured by the use of tools, for example, nuts, bolts, screws, or washers. Such hardware may also releasably secure the modular support and utilize, for example, spring pins, or other such hardware without the use of tools.

It should be appreciated various embodiments of a modular rack system may exist utilizing compatible anchor assemblies, modular supports, and connecting hardware. Embodiments of anchor assemblies may be used in combinations to provide various mounting options of electronic equipment or other accessories. As one of many examples, a modular support 160 with a plurality of openings 190 disposed in a single column vertically aligned from upper end 170 to lower end 180 as illustrated in FIG. 6 600 may be used for all modular supports in a system. In such an example, two modular supports 160 may be used for a "two post rack" application where the electronic equipment 210 is mounted in the plurality of openings 190 between two adjacent modular supports.

Figure 13:
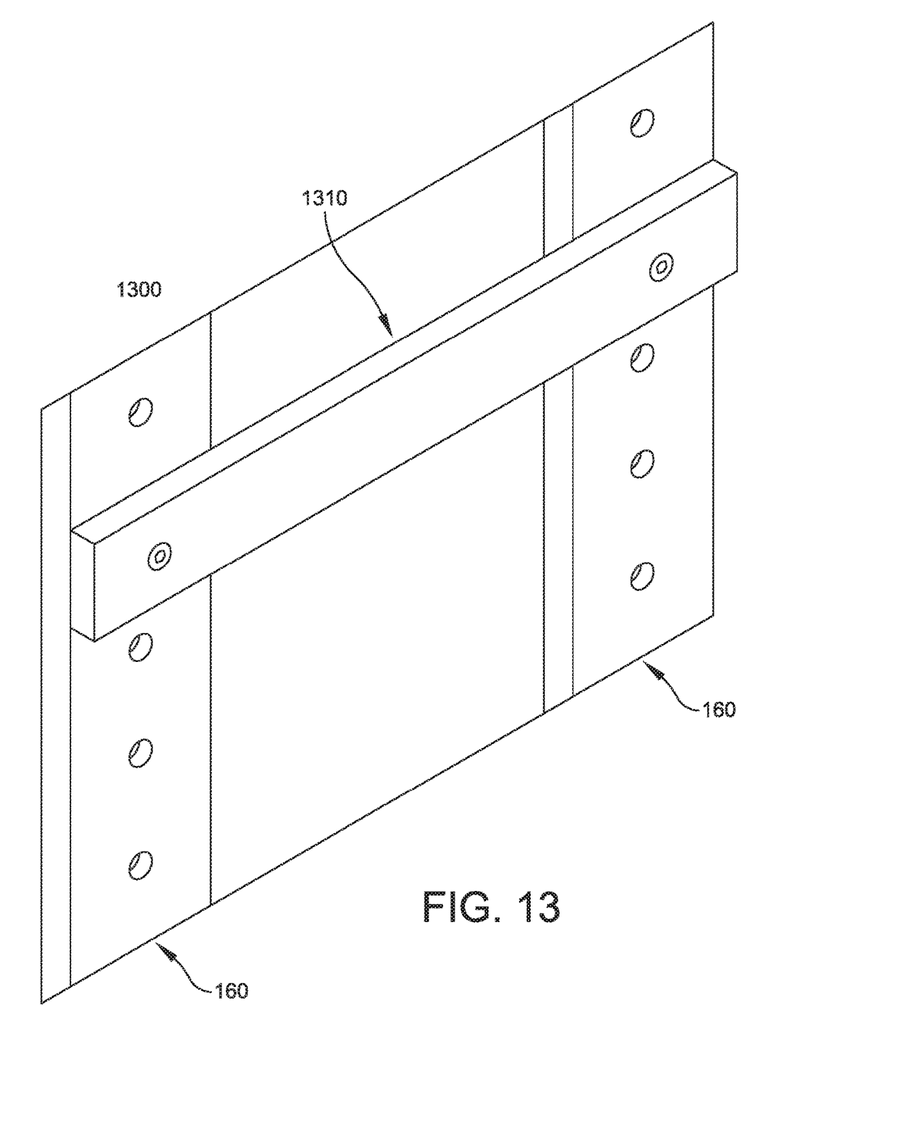
FIG. 13 illustrates a perspective view of a cross member assembly assembled with a modular support in accordance with various embodiments of this disclosure.

FIG. 13 illustrates a perspective view of a cross member assembly assembled with a modular support 1300 in accordance with various embodiments of this disclosure. A cross member assembly 1310 may be configured to provide additional mechanical support between modular supports 160 in the event of additional loading within the modular supports. It should be appreciated the cross member assemblies 1310 may be configured in any position on any modular support 160 to effect the necessary additional stabilization for the installed electronic equipment.

Figure 14:
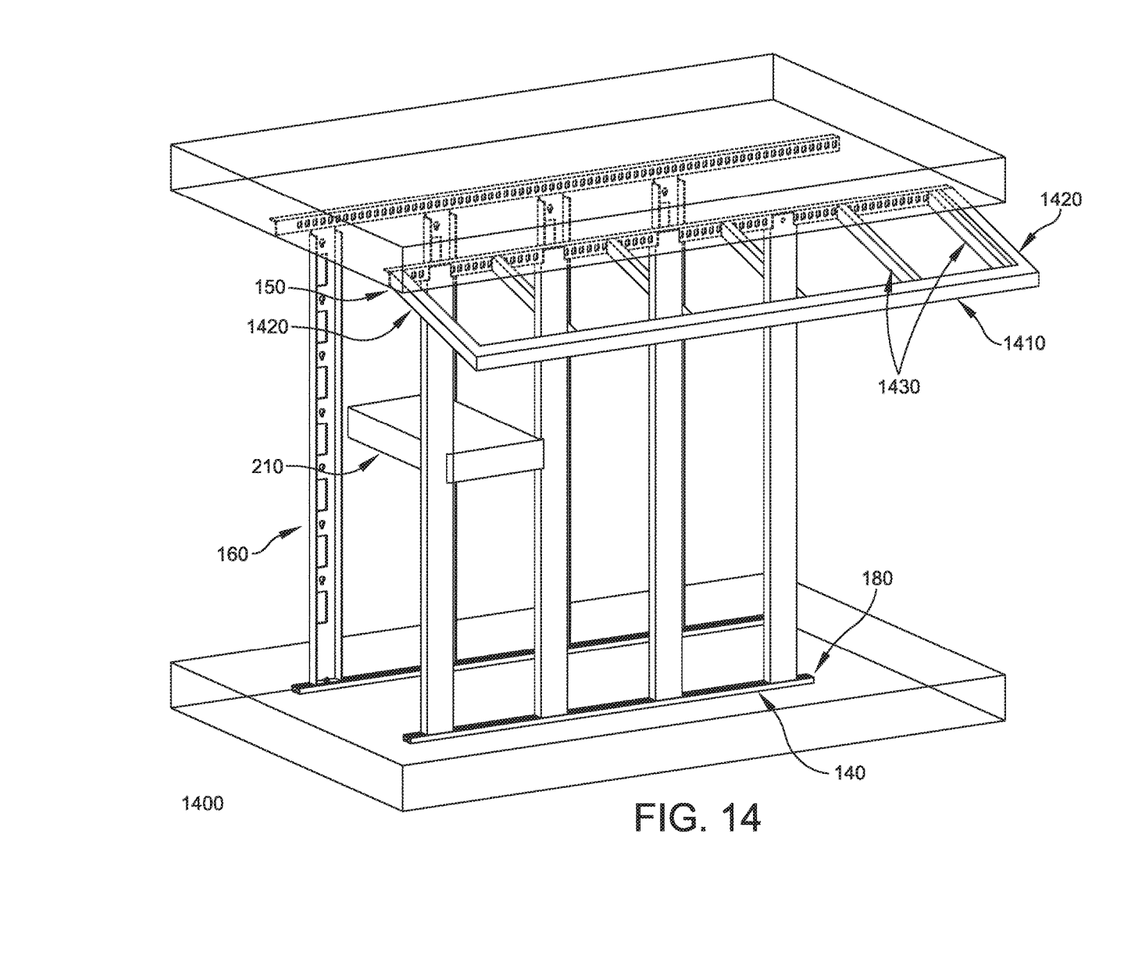
FIG. 14 illustrates a perspective view of a cantilever assembly mounted a modular rack system in accordance with various embodiments of this disclosure.
Figure 15:
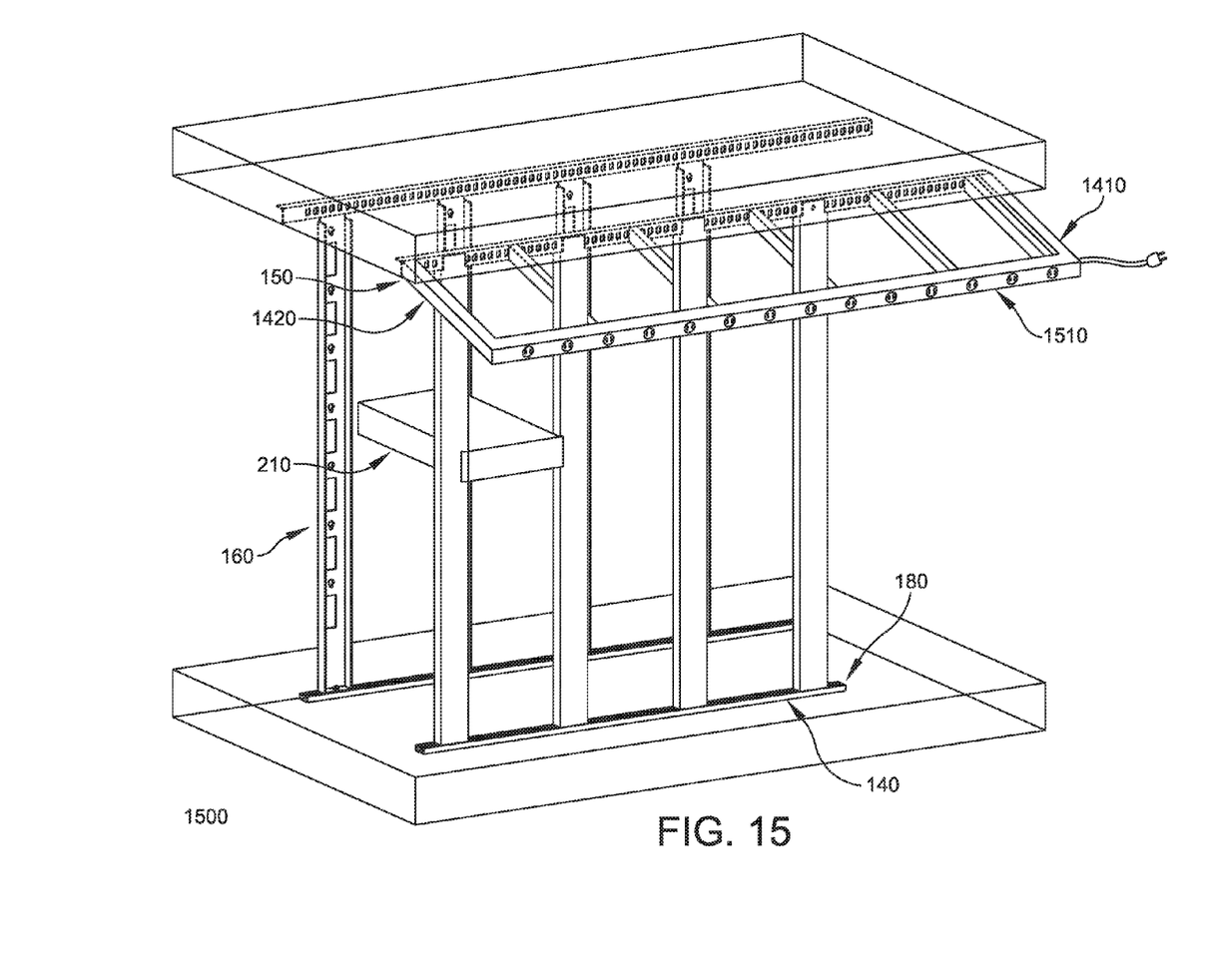
FIG. 15 illustrates a perspective view of a bus bar assembly mounted a modular rack system in accordance with various embodiments of this disclosure.

Referring to FIG. 14, a cantilever assembly 1410 is shown being releasably secured to the modular supports 160 of a modular rack system 1400. The cantilever assembly 1410 is configured to support various types of electronic equipment, such as bus bar assembly, network basket, power ladders, and other means of distribution or conveyance. As shown, in one embodiment, the cantilever assembly 1410 includes two arms, each indicated at 1420, and several cross members 1430. Each arm 1420 is configured to be releasably secured to the modular supports 160 by fasteners at a desired elevation along lengths of the modular supports 160. Cross members 1430 are secured to the arms 1420 by fasteners as well. FIG. 15 illustrates the cantilever assembly 1410 supporting an electrical power distribution unit 1510. Other objects may be supported by the cantilever assembly 1410 as detailed infra and are contemplated in embodiments of this disclosure.

Figure 16:
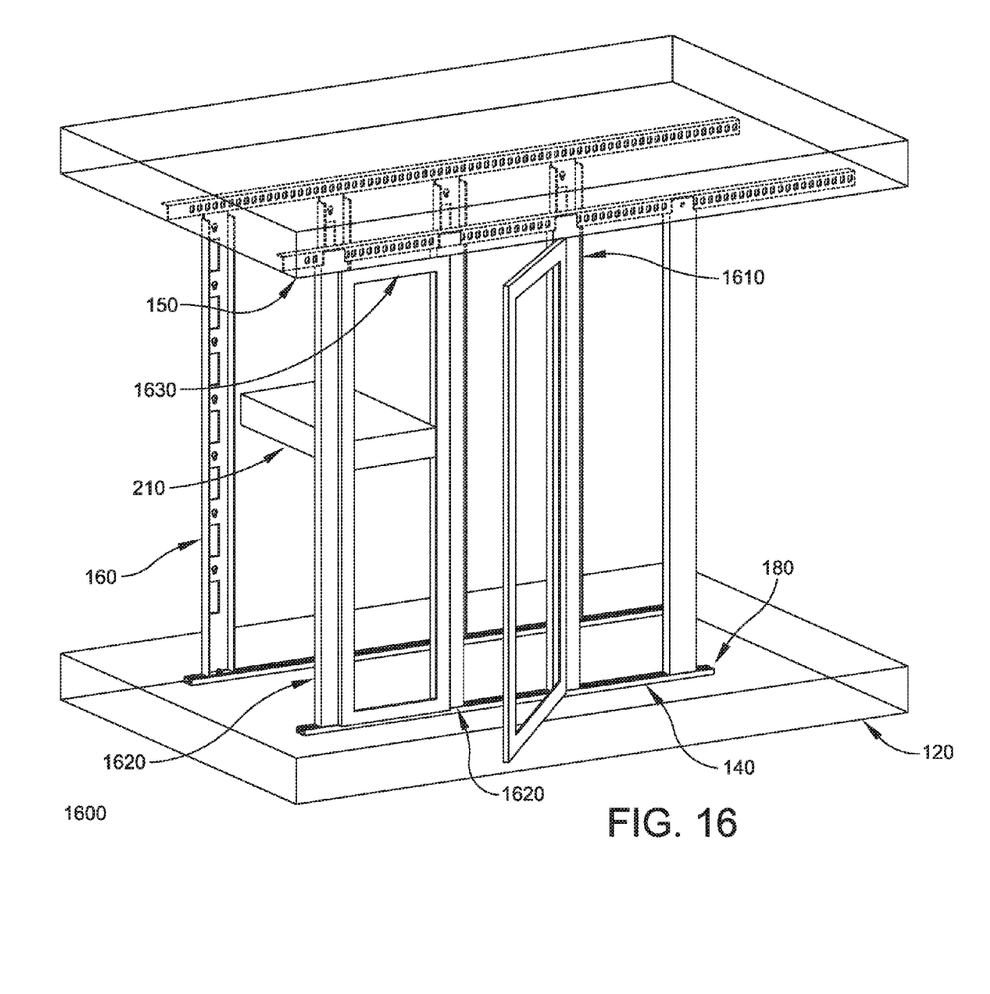
FIG. 16 illustrates a perspective view of a door frame and door assembly mounted a modular rack system in accordance with various embodiments of this disclosure.

FIG. 16 illustrates a perspective view of a door frame and door assembly mounted to a modular rack system in accordance with various embodiments of this disclosure. A modular rack system may further include at least one door frame assembly 1610 between assembled modular supports 160. FIG. 16 illustrates two door frame assemblies 1620; however, it should be appreciated that any appropriately sized construction of modular supports 160 may allow for a door frame assembly 1610 to be utilized. A door frame assembly 1610 includes two vertical supports 1620 and a horizontal support 1630. Each door fame assembly 1610 is configured to support one door that provides access to the electronic equipment 210.

Alternate embodiments of the modular rack system may further include one or more blanking panels releasably secured to the modular supports 160. Such panels may be used to enclose the modular rack system to maintain air containment or security. Blanking panels may be fabricated from clear, translucent, opaque, or transparent materials which mount between modular supports 160 in locations where electronic equipment 210 is not present to maintain the intended thermal characteristic separation or prevent unauthorized access. A blanking panel may be sized based on the dimensions of the rack space intended to be "blanked" or be a variable size component.

At least some of the modular rack systems described herein may be provided as a kit to be assembled and installed by the end user. Such a kit may be configured to mount electronic equipment and include a bottom anchor assembly, a top anchor assembly, a modular support with an upper end, a lower end, and a plurality of openings configured to mount electronic equipment, a bottom anchor assembly configured to be secured to a floor and releasably secure the lower end of the modular support, a top anchor assembly configured to be secured to a ceiling and releasably secure the upper end of the modular support, and a cantilever assembly releasably secured to the modular support at an elevation along a height of the modular support, the cantilever assembly configured to support electronic equipment.

Such a modular rack system kit may further include a plurality of bottom anchor assemblies, a plurality of top anchor assemblies, a plurality of modular supports where each modular support has an upper end a lower end, and a plurality of openings disposed therein and configured to mount equipment, and the plurality of modular supports is extended and retracted to achieve a height. The kit may further include a plurality of cable management assemblies configured to be supported by the plurality of modular supports, a plurality of blanking panels releasably secured to the plurality of modular supports to enclose a space defined by the plurality of modular supports, or a door frame assembly disposed between the plurality of modular supports, the door frame assembly including two vertical supports and a horizontal support, the door fame assembly being configured to support one or more doors.

It should be understood that the modular rack system of embodiments of the present disclosure may be used to control the flow of cooling or exhaust air from equipment and may be used to provide security of the contained electronic devices by enclosing same with the use of blanking panels, door assemblies 1610, and other associated devices to maintain the privacy and security of the devices contained within the modular rack system. Modular rack systems described herein provide a highly configurable support structure on which a variety of equipment may be implemented.

Modular rack systems disclosed herein simplify the design of new or existing data center buildings, containers, or enclosures, to eliminate or reduce a reliance on the structure of a building to support the electronic equipment 210, the means of conveyance and distribution for the electronic equipment, to eliminate or reduce a need to use data center equipment to support the means of support, conveyance, or distribution, to enable the reduction of structures such as racks and rack equipment that may not be originally designed for data center use, or to save a data center business, time and money in building or outfitting a data center. At least some modular rack systems disclosed herein may be assembled with a minimal number of tools, or no tools, by a minimum number of personnel.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A containerized data center modular rack system configured to mount electronic equipment, comprising:
   a container structure with a floor and a ceiling configured to house a modular rack system;
   a plurality of bottom anchor assemblies disposed within the floor of the container structure;
   a plurality of top anchor assemblies disposed within the ceiling of the container structure; and at least three modular supports each having an upper end configured to be removably secured to one of the plurality of top anchor assemblies disposed within the ceiling of the container structure, a lower end configured to be removably secured to one of the plurality of bottom anchor assemblies disposed within the floor of the container structure, and a plurality of openings configured to mount electronic equipment.

2. The modular rack system of claim 1, further comprising a twist lock insert assembly disposed axially on the upper end of each of the at least three modular supports and on the lower end of each of the at least three modular supports.

3. The modular rack system of claim 2, wherein each of the plurality of bottom anchor assemblies and each of the plurality of top anchor assemblies includes a base with a first side, a second side, and a first fastening connector, where the first fastening connector is disposed axially on the first side of the base and configured to operatively connect and releasably secure the lower end of one of the at least three modular supports or the upper end of one of the at least three modular supports utilizing one twist lock insert assembly.

4. The modular rack system of claim 3, further comprising a container twist lock insert assembly disposed within the floor or the ceiling of the container structure and a second fastening connector disposed axially on the second side of the base and configured to operatively connect and releasably secure the base of the plurality of bottom anchor assemblies and the plurality of top anchor assemblies to the floor or the ceiling of the container structure utilizing the container twist lock insert assembly disposed therewithin.

5. The modular rack system of claim 1, wherein each of the plurality of bottom anchor assemblies and the plurality of top anchor assemblies includes a "U" bracket which is disposed on the floor or the ceiling of the container structure and is configured to releasably secure the lower end of one of the at least three modular supports or the upper end of one of the at least three modular supports and is secured to the floor or the ceiling of the container structure.

6. The modular rack system of claim 1, further comprising at least one cross member releasably secured between two of the at least three modular supports.

7. The modular rack system of claim 1, wherein each of the plurality of openings in the at least three modular supports includes a threaded flange assembly.

8. The modular rack system of claim 1, wherein openings of the plurality of openings in the at least three modular supports are disposed in pairs within a same horizontal plane at a same height above the floor.

9. The modular rack system of claim 1, wherein each of the at least three modular supports is extendable and retractable to achieve a desired height.

10. The modular rack system of claim 1, wherein each of the at least three modular supports is configured to support cable management equipment.

11. The modular rack system of claim 1, further comprising a cantilever assembly having a plurality of arms and a plurality of supports releasably secured to the at least three modular supports at an elevation along a height of adjacent modular supports, the cantilever assembly configured to support electronic equipment.

12. The modular rack system of claim 11, further comprising one of a bus bar assembly, a network basket and a power ladder coupled to the cantilever assembly.

13. The modular rack system of claim 1, further comprising a blanking panel releasably secured to one of the at least three modular supports to enclose a space defined by two of the at least three modular supports.

14. The modular rack system of claim 1, further comprising a door frame assembly disposed between two of the at least three modular supports, the door frame assembly including two vertical supports and a horizontal support, the door fame assembly being configured to support one or more doors.

15. A method of installing a modular rack system, including:
  installing a plurality of bottom anchor assemblies within a floor of a container structure;
  installing a plurality of top anchor assemblies within a ceiling of the container structure;
  installing at least three modular supports, each modular support of the at least three modular supports includes an upper end and a lower end, and wherein installing each modular support of the at least three modular supports includes adjusting each modular support of the at least three modular supports to achieve a height, assembling the lower end of each modular support of the at least three modular supports into a bottom anchor assembly of the plurality of bottom anchor assemblies, and assembling the upper end of each modular support of the at least three modular supports into a top anchor assembly of the plurality of top anchor assemblies; and
  installing electronic equipment between adjacently installed modular supports of the at least three modular supports.

16. The method of claim 15, wherein installing the at least three modular supports includes:
  releasably securing a first twist lock insert assembly disposed axially on the lower end of one of the at least three modular supports to a first fastening connector disposed on a first side of a base of one of the plurality of bottom anchor assemblies; and
  releasably securing a second twist lock insert assembly disposed axially on the upper end of the one of the at least three modular supports to a first fastening connector disposed on a first side of a base of one of the plurality of top anchor assemblies.

17. The method of claim 16, wherein installing a bottom anchor assembly of the plurality of bottom anchor assemblies in the floor of the container structure includes:
  releasably securing a second fastening connector disposed axially on a second side of the base of each bottom anchor assembly of the plurality of bottom anchor assemblies to a container twist lock insert assembly of the plurality of container twist lock insert assemblies disposed within the floor of the container structure.

18. The method of claim 16, wherein installing a top anchor assembly of the plurality of top anchor assemblies in the ceiling of the container structure includes:
  releasably securing a second fastening connector disposed axially on a second side of each top anchor assembly of the plurality of top anchor assemblies to a container twist lock insert assembly of the plurality of container twist lock insert assemblies disposed within the ceiling of the container structure.

19. The method of claim 15, wherein installing the at least three modular support further includes:
  releasably securing the lower end of each modular support of the at least three modular supports to a "U" bracket disposed on the floor of the container structure; and
  releasably securing the upper end of each modular support of the at least three modular supports to a "U" bracket disposed on the ceiling of the container structure.

* * * * *